United States Patent [19]

Sakawaki

[11] 4,267,212
[45] May 12, 1981

[54] SPIN COATING PROCESS

[75] Inventor: Shinichi Sakawaki, Asaka, Japan

[73] Assignee: Fuji Photo Film Co., Ltd., Minami-ashigara, Japan

[21] Appl. No.: 77,070

[22] Filed: Sep. 19, 1979

[30] Foreign Application Priority Data

Sep. 20, 1978 [JP] Japan ................ 53-115368

[51] Int. Cl.³ .................... B05D 5/10; B05D 1/40
[52] U.S. Cl. ................ 427/240; 427/425; 430/640; 430/935
[58] Field of Search .......... 427/240, 421, 359, 425, 427/346; 96/67; 118/52; 430/640

[56] References Cited

U.S. PATENT DOCUMENTS

| 4,075,974 | 2/1978 | Plows et al. .................. 118/52 |
| 4,113,897 | 9/1978 | Nosker ......................... 427/240 |
| 4,124,411 | 11/1978 | Meuleman et al. ............ 427/240 |
| 4,175,145 | 11/1979 | Fechter ......................... 427/240 |

OTHER PUBLICATIONS

Massey et al., "Glass Slurry Deposition", IBM Technical Disclosure Bulletin, vol. 14, No. 10, Mar. 1972.

*Primary Examiner*—Ronald H. Smith
*Assistant Examiner*—Janyce A. Bell
*Attorney, Agent, or Firm*—Sughrue, Rothwell, Mion, Zinn and Macpeak

[57] ABSTRACT

A process for spin coating a substrate such as a semiconductor wafer uniformly with a coating solution such as a photographic emulsion by rotating the substrate at a first speed while simultaneously applying the coating solution at a radially moving position. Once the substrate has been initially covered, the speed of rotation of the substrate is increased and rotation continues until a uniform coating is obtained.

16 Claims, 4 Drawing Figures

SPIN COATING PROCESS

BACKGROUND OF THE INVENTION

The present invention relates to a spin coating process, and more particularly, to a spin coating process for providing a liquid coating of uniform thickness over the entire surface of a base plate.

In the manufacture of semiconductor devices, a spin coating process has heretofore been employed to coat the photoresist onto a base plate. For example, the base plate or substrate may be a photomask blank, silicon wafer or the like constructed as a glass sheet having a metal film. Both a manual process for coating photoresist liquids and an automatic coating process using an automatic photoresist coating machine are known. In the manual coating process, the base plate is placed on a turntable of a spinner, coating liquids are taken by hand into, for example, a pipette, the liquids are dropped on a substantially central portion of the base plate, and thereafter, the turntable is rotated. When the coating liquids from the pipette are initially dropped on the base plate, the coating liquids are spread only onto the central portion. Thus, after the coating liquids have been fed from the pipette to the central portion of the base plate, the turntable is rotated at a low speed to spread the coating liquids over the entire surface of the base plate by means of a centrifugal force after which the table is rotated at a high speed to spread extra liquid so as to obtain the desired thickness of film.

In the automatic coating machine, a nozzle for feeding coating liquids is arranged above the turntable. when the base plate is placed on the turntable, a given quantity of coating liquids are fed to a central portion of the base plate. Thereafter, the turntable is rotated at a low speed, and the coating liquids are spread over the entire surface of the base plate. Subsequently, the turntable is rotated at a high speed to obtain a coated film of desired thickness.

Where the size of the base plate is small, for example, from 3 to 4 inches, and/or certain kinds of photoresist coating liquids are used, the abovementioned processes will suffice. However, where the size of base plate is large such as 5 or 6 inches or certain other kinds of coating liquids are used, it has been found that even for smaller sizes of base plates, producing a coating of uniform thickness over the entire surface is impossible utilizing the abovementioned processes. For example, where the coating liquids are silver halide emulsions of which the binder is gelatin or where the coating solvent has a quick-drying property such as acetone, even if the coating liquids are fed from the nozzle to the central portion after which the turntable is rotated at a low speed to spread the coating liquids over the entire surface and the turntable is further rotated to obtain the desired film thickness, it nonetheless still results that the film thickness of a portion to which the coating liquids are first applied (particularly, the film thickness in a boundary in that portion) is clearly different from that of a portion spread by rotation of the turntable. The phenomenon is particularly remarkable where silver halide emulsions are coated onto the base plate. When the film thickness after coating different in parts as described above, the sensitivity and developing speed in the differenting portions are different as a consequence of which the line width of a developed image will vary which is a most certain disadvantage. For example, the electrical characteristics obtained by forming a semiconductor device using such an image will be different for different parts of the device.

This problem will be described in more detail with reference to FIG. 1, which illustrates a conventional spin coating process. When a base plate 10 or substrate is placed on a turntable (not shown), coating liquids are dropped thereon from a nozzle 11 above the central portion of the base plate and the coating liquids are spread over the central portion 12 of the base plate forming a boundary 13. Then, when the turntable is rotated at a low speed (normally at 100 to 1000 rpm), the coating liquids are spread outwardly by centrifugal force to cover the whole surface of the base plate. Thereafter, when the turntable is rotated at a high speed (normally at 2000 to 6000 rpm) for a predetermined period of time, extra coating liquids are removed by the centrifugal force to obtain a film of uniform thickness as desired. Some photoresist coating liquids may be coated substantially uniformly in accordance with this process. However, if an attempt is made to coat some kinds of photoresist coating liquids such as a quick-drying solvent like acetone used as the coating solvent or gelatinous silver halide emulsions in accordance using such a process, a coating of uniform thickness over the whole surface may not be obtained. For example, when the turntable is rotated at a low speed after the gelatinous silver halide emulsions have been fed as shown in FIG. 1, the emulsions on the base plate are not uniformly spread outwardly but are spread along several radial passages 20 as shown in FIG. 2. As a consequence, the emulsions are not coated onto portions of the base plate where no radial passages 20 are formed. It is believed that such a phenomenon occurs because of poor wetting of the silver halide emulsions on the base plate. Since many photoresist coating liquids are dissolved in an organic coating solvent, the base plate is well wetted due to the organic solvent and such a phenomenon generally does not occur. However, if the coating solvent has an extremely high volatility, a boundary mark 13 as in FIG. 1 often appears on the film after coating.

In order to overcome the above-described difficulty, the inventors have earlier proposed, as disclosed in Japanes Laid-Open Patent Application No. 49955/1978, a spin coating method in which, after a coating solution is supplied onto a substrate held horizontally, the substrate is rotated around a rotary shaft perpendicular to the substrate so as to obtain a coated film on the substrate. In this process, it is not until after the coating liquid is substantially uniformly coated substantially over the entire surface of the substrate that the substrate is rotated.

According to this method, the coating liquid is substantially uniformly coated substantially over the entire surface of the substrate before the substrate is rotated, as described above. Therefore, with any kind of coating solution, the entire surface of a substrate can be coated to a uniform thickness even if the size of the substrate is large. This is one of the significant effects of this method. Especially in the case where a substrate is coated with the abovedescribed silver halide emulsion, the coated substrate is free from the fatal defect that the emulsion is spread outwardly along radial paths on the substrate. That is, the substrate can be uniformly coated with the emulsion.

However, this method has still remaining problems. That is, the method is disadvantageous in that when a coating device such as a bar coater is employed as means for supplying a coating solution uniformly over the entire surface of a substrate before the substrate is rotated, the coating device must be cleaned for every coating operation. In order to apply such a coating method to an automatic coating machine, in addition to the coating device a cleaning device must be provided, and accordingly the entire device becomes intricate in construction and high in manufacturing cost. Instead of the above-described coating devices, a coating solution supplying nozzle may be employed to supply the coating solution to the substrate. In this case, the nozzle is operated in a scanning mode to a supply the coating solution substantially over the entire surface of the substrate. However, this method is still disadvantageous in that it is necessary to supply an amount of coating solution larger than that in the case where a coating device is used as mentioned above. Furthermore, the method is not economical because a larger part of the coating solution supplied onto the substrate is thrown off the substrate by the subsequent rotation and often the coating solution thus thrown off cannot be used again.

SUMMARY OF THE INVENTION

It is therefore an object of this invention to provide a spin coating method in which the entire surface of a substrate can be coated at a uniform thickness with any kind of coating solution.

It is another object of the invention to provide a spin coating method in which a substrate can be coated with a coating solution at a uniform thickness even though the size of the substrate is large.

It is a further object of the invention to provide a spin coating method which is suitable for automation.

It is a still further object of the invention to provide a spin coating method which is suitable for automation and in which little coating solution is wasted.

These and other objects of the invention can be achieved by the provision of a spin coating method in which, after a coating solution is supplied onto a substrate held horizontally, the substrate is rotated about a rotary axis perpendicular to the substrate. A coated film is formed at a desired thickness on the substrate by controlling the speed of rotation of the substrate, due to the fact that, according to the invention, while the substrate is being rotated at a low speed of 50 to 150 rpm., a coating solution supplying nozzle is moved radially of the rotating substrate to supply the coating solution onto the substrate so as to substantially uniformly coat the substrate with the coating solution. Thereafter, the substrate is rotated again, so that the thickness of the coating solution coated over the substrate will be a uniform desired value.

DETAILED DESCRIPTION OF THE PREFERRED EMBODIMENTS

The spin coating method according to this invention will be described in detail with reference to FIGS. 3 and 4.

Figure 3:
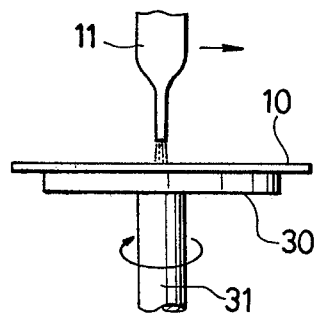
FIGS. 3 and 4 are front views and plan views illustrating the process as it may be practiced in accordance with several embodiments of the present invention.
Figure 4:
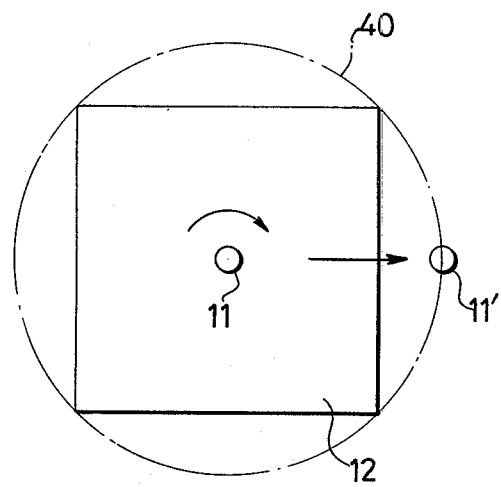

An example of the method of the invention is illustrated in FIG. 3 in which reference numeral 30 designates a turntable which rotates around its shaft 31. A substrate 10 is attached to the turntable 30 by a suction device (not shown) so that accordingly it rotates with the rotation of the turntable 30. The substrate 10 is rotated first at a low speed (50 to 150 rpm.).

When the substrate 10 is rotated at the low speed, a nozzle 11 positioned above the center of rotation of the substrate 10 starts supplying a coating solution. The coating solution from the nozzle 11 spreads towards the periphery of the substrate by a centrifugal force created by the rotation of the substrate 10. The nozzle 11 continuously supplies the coating solution while moving radially of the substrate 10. That is, the nozzle 11 supplies the coating solution substantially over the entire surface of the substrate 11 while moving to the position 11' (which is the end of the rotating substrate 12) in FIG. 4.

Figure 1:
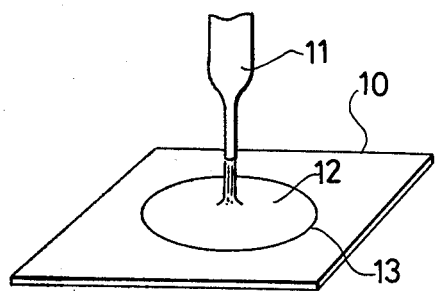
FIG. 1 is a perspective view showing a conventional spin coating method.
Figure 2:
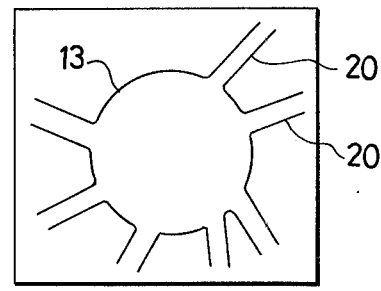
FIG. 2 is a plan view showing the results where gelatinous silver halide emulsions are applied in accordance with the process shown in FIG. 1.

As described above, the nozzle 11 is moved while supplying the coating solution to the center of the substrate 10 rotating at a low speed of 50 to 150 rpm. supplying the coating solution radially of the rotating substrate 10. Accordingly, in the case where the substrate 10 is coated with, for instance, a silver halide emulsion using gelatin as its binder, the coating solution can be supplied uniformly to the entire surface of the substrate. As a result, the substrate thus coated is free from trouble in that the coating solution does not spread radially outwardly forming an unwanted boundary mark as shown in FIGS. 1 and 2. Furthermore, according to the method of the invention, while the coating solution supplied to be surface of the substrate 10 is spreading outwardly by a centrifugal force created by the rotation of the substrate 10, the coating solution is further supplied through the nozzle 11 which is moving radially of the rotating substrate 10. Therefore, with the method of the invention, much less coating solution need be supplied onto the surface of the substrate than with the conventional method in which the coating solution is supplied substantially over the entire surface of the stationary substrate. According to the experiments conducted by the inventors, it has been confirmed that the entire surface of a substrate can be coated with about half of the amount of coating solution which had to be supplied with the conventional method.

The entire surface of the substrate can thus be coated with the coating solution. However, the substrate may not always be coated to a desired thickness and the thickness of the coating liquid applied to the substrate may not always be uniform over the entire surface thereof after the initial rotation operation. In order to overcome these difficulties, the turntable is further rotated at a higher speed to remove excessive amounts of coating solution from the surface of the substrate and to make the thickness of the coated film uniform over the entire surface of the substrate.

The speed of rotation of the substrate required for removing the excessive amount of coating solution from the substrate and making the thickness of the coated film uniform over the entire surface of the substrate is, in general, 1,000 to 6,000 rpm. However, this speed range is not limitative as the actual speed employed depends on the desired thickness of coated film, the viscosity of coating solution and the amount of solid matter contained in a coating solution. In the case where the coating solution is a silver halide emulsion using gelatin as its blinder, the speed is 200 to 2,000 rpm., preferably 200 to 1,000 rpm. If necessary, after the substrate has been rotated at the high speed mentioned above, it may be rotated at a third yet higher speed.

The radial speed of movement of the nozzle during the period the substrate 10 is rotated at the low speed (50 to 150 rpm.) is not particularly limited. Nevertheless, it is desirable that it be equal to or lower than the speed at which the coating solution supplied onto the substrate 10 is spread coaxially over the substrate 10 by the centrifugal force. That is, if the speed of movement of the nozzle is excessively high, then it is impossible to uniformly coat the substrate 10 with the coating solution. On the other hand if the speed of movement of the nozzle 11 is sufficiently low, then the substrate can be uniformly coated with the coating solution. However, if it is excessively low, some of the coating solution will be wasted. Thus, the most preferable speed of movement of the nozzle 11 is equal to or just slightly lower than the speed at which the coating solution supplied onto the substrate 10 is spread coaxially over the substrate 10 by the centrifugal force, as described above.

Furthermore, the rate at which the coating solution is supplied through the nozzle 11 is not particularly limited. Should the rate at which the coating solution is supplied is increased, the speed of spreading the coating liquid supplied onto the substrate is increased proportionately and the speed of movement of the nozzle should be increased accordingly. If the rate of supply of the coating solution is decreased then the speed of the movement of the nozzle should likewise be decreased.

Preferred methods for coating a rectangular substrate subjected to spin coating have been described. Nevertheless, it should be noted that the invention is not limited thereto or thereby. That is, for instance, a round substrate can be subjected to spin coating according to the invention. Furthermore, in the above-described example of the spin coating method, the nozzle is moved from the center of rotation of the substrate to the periphery. The nozzle may otherwise be moved from the periphery (the position 11' in FIG. 4) of the substrate to the center of rotation of the substrate. In the latter case, the amount of coating solution which must be supplied the substrate is more than that in the case shown in FIG. 4 although the advantageous effects of the invention can still be obtained.

What is claimed is:

1. A spin coating method in which after a coating solution is supplied onto a horizontal substrate, said substrate is rotated about a rotary axis perpendicular to said substrate, and a coated film is formed to a desired thickness on said substrate by controlling the speed of rotation of said substrate, the improvement comprising; while said substrate is being rotated at a low speed of 50 to 150 rpm., moving a coating solution supplying nozzle radially of said rotating substrate to supply said coating solution onto said substrate to substantially uniformly coat said substrate with said coating solution and thereafter, said substrate is subsequently rotated to produce a desired thickness of said coating solution upon said substrate.

2. The spin coating method of claim 1, wherein the speed of rotation when said substrate is subsequently rotated is in the range of 1000 to 6000 rpm.

3. The spin coating method of claim 1, wherein said coating solution comprises a silver halide emulsion having a gelatin binder and wherein the speed of rotation when said substrate is again rotated is in the range of 200 to 2,000 rpm.

4. The spin coating method of claim 3 wherein said subsequent speed of rotation of said substrate is in a range of 200 to 1000 rpm.

5. The spin coating method of any of claims 1, 2, 3 or 4 wherein said substrate is rotated at a third speed greater than the speed at which it was first again rotated.

6. The spin coating method of any of claims 1, 2, 3 or 4 wherein the radial speed of said nozzle is equal to or less than the speed at which said coating solution spreads radially.

7. The spin coating method of any of claims 1, 2, 3 or 4 wherein said nozzle is moved radially outwardly.

8. A spin coating method comprising the steps of:
rotating a substrate about an axis perpendicular to said substrate at a first speed;
supplying a coating solution to a surface of said substrate from a starting position and moving radially with respect to said axis; and
rotating said substrate at a second speed greater than said first speed after portions of said substrate have been covered with said coating solution.

9. The spin coating method of claim 8 wherein said step of supplying said coating solution comprises supplying said coating solution through a nozzle.

10. The spin coating method of claim 8 wherein said first speed of rotation is in a range of 50 to 150 rpm.

11. The spin coating method of claim 10 wherein said second speed of rotation is in a range of 1000 to 6000 rpm.

12. The spin coating method of claim 10 wherein said coating solution comprises a silver halide emulsion having a gelatin binder and wherein said second speed of rotation is in a range of 200 to 2000 rpm.

13. The spin coating method of claim 12 wherein said second speed of rotation is in a range of 200 to 2000 rpm.

14. The spin coating method of any of claims 8, 9, 10, 11, 12 or 13 further comprising the step of:
rotating said substrate at a third speed higher than said second speed.

15. The spin coating method of any of claims 8, 9, 10, 11, 12 or 13 wherein the radial speed of said position is equal to or less than the speed at which said coating solution spreads radially.

16. The spin coating method of any of claims 8, 9, 10, 11, 12 or 13 wherein said position moves radially outwardly.

* * * * *